(12) United States Patent
Kaps et al.

(10) Patent No.: US 8,101,880 B2
(45) Date of Patent: Jan. 24, 2012

(54) OPERATOR CONTROL PANEL FOR A DOMESTIC APPLIANCE

(75) Inventors: Werner Kaps, Weiler-Simmerberg (DE); Thomas Frommelt, München (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 235 days.

(21) Appl. No.: 12/565,431

(22) Filed: Sep. 23, 2009

(65) Prior Publication Data

US 2010/0078304 A1    Apr. 1, 2010

(30) Foreign Application Priority Data

Sep. 26, 2008  (DE) .................. 10 2008 049 176

(51) Int. Cl.
 *H01H 9/00*  (2006.01)
(52) U.S. Cl. .......... 200/600; 200/5 A; 200/296; 345/173
(58) Field of Classification Search .................. 200/5 R, 200/5 A, 600, 296; 341/22, 33; 345/173
See application file for complete search history.

(56) References Cited

U.S. PATENT DOCUMENTS

| | | | | |
|---|---|---|---|---|
| 4,304,976 A | * | 12/1981 | Gottbreht et al. ............ | 219/702 |
| 4,413,252 A | * | 11/1983 | Tyler et al. ................... | 341/33 |
| 4,561,002 A | * | 12/1985 | Chiu ............................ | 341/26 |
| 4,894,493 A | * | 1/1990 | Smith et al. .................. | 200/5 A |
| 5,760,715 A | * | 6/1998 | Senk et al. .................. | 341/33 |
| 6,265,682 B1 | * | 7/2001 | Lee .............................. | 200/600 |
| 6,310,305 B1 | | 10/2001 | Kamino et al. | |
| 6,310,611 B1 | | 10/2001 | Caldwell | |
| 6,723,937 B2 | * | 4/2004 | Englemann et al. ......... | 200/600 |
| 7,180,017 B2 | * | 2/2007 | Hein ............................ | 200/5 R |
| 7,217,900 B2 | * | 5/2007 | Gama et al. .................. | 200/600 |
| 7,507,929 B2 | * | 3/2009 | Streifler ....................... | 200/600 |
| 7,652,220 B2 | * | 1/2010 | Weiss ........................... | 200/600 |
| 7,969,330 B2 | * | 6/2011 | Philipp ........................ | 341/33 |
| 2005/0133351 A1 | | 6/2005 | Hein | |
| 2007/0068789 A1 | | 3/2007 | Streifler | |
| 2008/0238444 A1 | | 10/2008 | Klopfer | |
| 2010/0096248 A1 | | 4/2010 | Yamauchi et al. | |

FOREIGN PATENT DOCUMENTS

| | | |
|---|---|---|
| DE | 32 45 803 A1 | 6/1984 |
| DE | 201 19 700 U1 | 2/2002 |
| DE | 202007006266 U1 | 8/2007 |
| DE | 10 2006 062 393 A1 | 6/2008 |
| GB | 2100853 A | 1/1983 |
| GB | 2437983 A | 11/2007 |
| WO | 0042626 A1 | 7/2000 |
| WO | 2008096639 A1 | 8/2008 |

* cited by examiner

*Primary Examiner* — Michael Friedhofer
(74) *Attorney, Agent, or Firm* — Laurence A. Greenberg; Werner H. Stemer; Ralph E. Locher

(57) ABSTRACT

An operator control panel for a domestic appliance includes a panel body having an operator control face facing a user and a rear face facing away from the operator control face. A sensor element of an electrically conductive material forms a capacitive sensor area together with the panel body. A conversion electronics system converts capacitance values generated in the sensor area into digital signals. The conversion electronics system is electrically conductively connected to the sensor element and is disposed on the rear face of the panel body. The sensor element and the conversion electronics system are firmly connected to the panel body and are two components which are mechanically decoupled from a control electronics system of the domestic appliance.

11 Claims, 1 Drawing Sheet

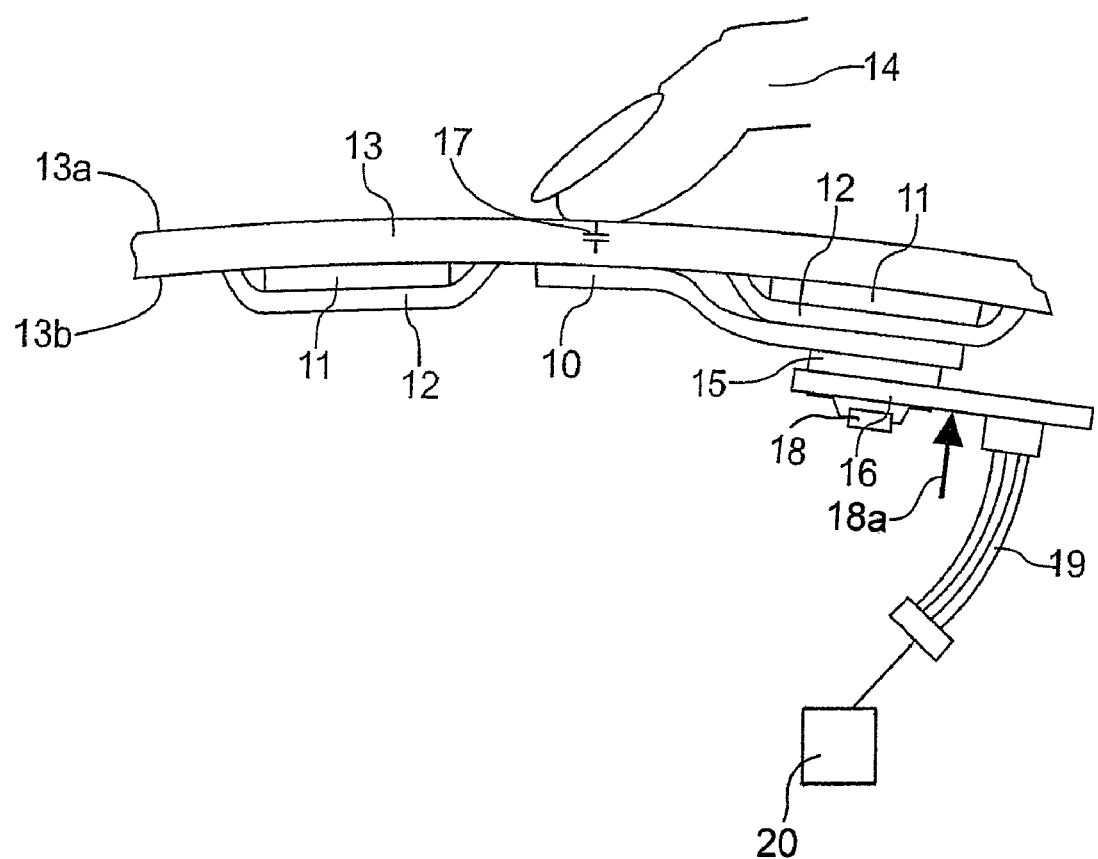

OPERATOR CONTROL PANEL FOR A DOMESTIC APPLIANCE

CROSS-REFERENCE TO RELATED APPLICATION

This application claims the priority, under 35 U.S.C. §119, of German Patent Application DE 10 2008 049 176.4, filed Sep. 26, 2008; the prior application is herewith incorporated by reference in its entirety.

BACKGROUND OF THE INVENTION

Field of the Invention

The invention relates to operator control panels for domestic appliances, in particular operator control panels having capacitive touch switches.

Touch switches are frequently used in electrical appliances, in particular in domestic appliances such as cookers, cook tops, microwave ovens, dishwashers, washing machines and the like. The touch switches trigger a specific switching operation simply by a user or an object touching them. In the case of a capacitive touch switch, a capacitive sensor element, together with the finger of a user, form a capacitance through a touch panel acting as a dielectric. That capacitance is variable depending on operation of the touch switch, that is to say a touch panel associated with the capacitive sensor element being touched or not being touched. The change in capacitance of the capacitive sensor element due to it being touched, has an effect on an output signal from the sensor circuit, and that is correspondingly evaluated by a connected evaluation circuit as operation of the capacitive touch switch. Capacitive touch switches are known, for example, from German Published, Non-Prosecuted Patent Application DE 32 45 803 A1.

In order to obtain such a capacitive sensor or switch, resilient functional elements, for example, are positioned directly on the control electronics system of the appliance. Electrical components required to convert the capacitive signal are seated directly beneath the proximity switch in that case. The operator control panel which is situated over those functional elements in that case forms a holder and therefore fixes the control electronics system and the structural element. The form, shape, contour or outline of the operator control panel is coupled directly to the control electronics system of the appliance. Therefore, each change in the form, shape, contour or outline of the operator control panel, that is to say in construction, also requires the control electronics system to be changed or adapted. Such a configuration of the sensor element and connection of the sensor element to the control electronics system are disclosed, for example, in German Utility Model DE 201 19 700 U1. In that case, the capacitive sensor element is printed onto the rear face of the panel body.

SUMMARY OF THE INVENTION

It is accordingly an object of the invention to provide an operator control panel for a domestic appliance having touch switches, which overcomes the hereinafore-mentioned disadvantages of the heretofore-known devices of this general type and which permits a greater degree of flexibility with regard to production.

With the foregoing and other objects in view there is provided, in accordance with the invention, an operator control panel for a domestic appliance, comprising a panel body having an operator control face which faces the user and a rear face which faces away from the operator control face. A sensor element of an electrically conductive material is disposed on the rear face of the panel body and, together with the panel body, forms a capacitive sensor area. A conversion electronics system converts the capacitance values generated in the sensor area into digital signals. The conversion electronics system is electrically conductively connected to the sensor element and is disposed on the rear face of the panel body. In this case, the sensor element and the conversion electronics system are firmly connected to the panel body. In addition, the sensor element and the conversion electronics system are two components which are mechanically decoupled from a control electronics system of the domestic appliance.

According to the invention, the sensor element and the conversion electronics system are firmly connected to the rear face of the panel body. The conversion electronics system, which is connected to the sensor element, provides all of the output signals required for the various devices for further processing in the extremely wide variety of areas of application in the domestic appliance industry. Due to the (mechanical) decoupling of the capacitive sensors, including the conversion electronics system, from the control electronics system of the appliance, the extremely wide variety of configurations, structures and functional elements can be rapidly converted and implemented. The respective adaptation to the present construction is then performed through the use of programming and parameterizing the conversion electronics system.

Due to the decoupling of the structural and functional elements from the actual control electronics system of the appliance, various customer requirements can be accommodated in a highly flexible manner. At the same time, this results in a reduction in the sizes of the printed circuit boards for the control electronics, together with associated cost savings, both in terms of material use and in terms of production engineering.

In accordance with another feature of the invention, the sensor element is surrounded, in its peripheral direction, by a shielding element which is firmly connected to the panel body. The shielding element includes, for example, a shielding layer, which is connected to the operator control panel and is composed of an electrically conductive material, and an insulation layer which is composed of an electrically insulating material and substantially completely surrounds the shielding layer.

In accordance with a further feature of the invention, the sensor element and/or the shielding element are preferably printed onto the rear face of the panel body. The sensor element and the shielding element (that is to say the shielding layer and insulation layer) are preferably printed onto the rear face of the panel body by printing-on an electrically conductive or electrically non-conductive varnish using conventional printing techniques. By way of example, the known pad printing method can be used as the printing technique. It is likewise possible to use the screen printing method.

Electrically non-conductive varnishes, so-called insulating varnishes, and also electrically conductive varnishes, are known from the prior art and are commercially available.

In accordance with an added feature of the invention, the sensor element and the conversion electronics system are connected to one another through the use of a connection element which is composed of an electrically conductive material. By way of example, the connection element is formed from an electrically conductive film or foil and/or an electrically conductive paste, for example an electrically conductive adhesive layer. Electrically conductive adhesives are known from the prior art and are commercially available.

In accordance with an additional feature of the invention, a retaining device for pressing the conversion electronics system and the sensor element against one another is also provided.

In accordance with yet another feature of the invention, it goes without saying that a plurality of sensor elements can be disposed on the rear face of the panel body at an operator control panel.

In accordance with yet a further feature of the invention, the conversion electronics system is electrically connected to the control electronics system of the domestic appliance through the use of a cable connection which is preferably formed by a flexible cable.

With the objects of the invention in view, there is also provided an operator control panel for a domestic appliance, comprising a panel body having an operator control face facing the user and a rear face facing away from the operator control face. A sensor element, which is disposed on the rear face of the panel body and is firmly connected to the panel body and composed of an electrically conductive material, forms a capacitive sensor area together with the panel body. Furthermore, a conversion electronics system for converting the capacitance values generated in the sensor area into digital signals, is disposed on the rear face of the panel body. The conversion electronics system is likewise firmly connected to the panel body and electrically conductively connected to the sensor element. The conversion electronics system is electrically connected to a control electronics system of the domestic appliance through a flexible cable connection.

With the objects of the invention in view, there is concomitantly provided an operator control panel for a domestic appliance, comprising a panel body having an operator control face which faces the user and a rear face which faces away from the operator control panel. A plurality of sensor elements, which are printed onto the rear face of the panel body and are composed of an electrically conductive material, each form a respective capacitive sensor area together with the panel body. Furthermore, at least one conversion electronics system, for converting the capacitance values generated in the sensor areas into digital signals, is disposed on the rear face of the panel body. The conversion electronics system is firmly connected to the panel body and electrically conductively connected to the sensor elements. The sensor elements and the at least one conversion electronics system are components which are mechanically decoupled from a control electronics system of the domestic appliance.

Other features which are considered as characteristic for the invention are set forth in the appended claims.

Although the invention is illustrated and described herein as embodied in an operator control panel for a domestic appliance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a fragmentary, diagrammatic, partly-sectional, side-elevational view of an operator control panel according to the present invention, with reference to which the above-described and further features and advantages of the invention will be explained more clearly in the following description of a preferred, non-restrictive exemplary embodiment.

DETAILED DESCRIPTION OF THE INVENTION

The operator control panel for domestic appliances forms a functional group having a capacitive touch sensor area and associated conversion electronics. This functional group is disposed on the rear face of the panel body of an operator control panel and is firmly, that is to say permanently, connected to the operator control panel. The electronic components (sensor elements, conversion electronics) which are mounted on the operator control panel are mechanically decoupled from the (central) control electronics system of the domestic appliance, and therefore the control electronics system can be constructed fundamentally independently of the structure of the operator control panel and can be kept in stock for production.

Referring now in detail to the single FIGURE of the drawing, there is seen an operator control panel which has a panel body 13 having an operator control face 13a (at the top in the FIGURE) that faces the user and a rear face 13b (at the bottom in the FIGURE) which is averted from the user face. The panel body 13 may optionally be slightly curved, as shown in the FIGURE, or may be substantially flat.

The operator control panel is constructed with a plurality of capacitive touch switches which each have a sensor area, with the FIGURE illustrating only one such sensor area by way of example. The sensor area is formed by a sensor element 10 which is disposed on the rear face 13b of the panel body 13 and is composed of an electrically conductive material and is firmly, that is to say permanently, connected to the panel body 13. The sensor element 10 is preferably composed of an electrically conductive material with an electrical line resistance which is as low as possible.

The sensor element 10 and therefore the sensor area can, in accordance with the desired functions, assume any desired geometric configuration which follows the construction of the operator control panel. In this case, the sensor element 10 on the rear face 13b of the panel body 13 reflects only the physical configuration of the structural elements. However, it remains a purely capacitive functional area. In this way, sensor areas can be generated independently of one another, with these sensor areas generating one or more capacitive values by being capacitively coupled, for example, to one or more fingers 14 or one or more other objects.

In order to concentrate a capacitance 17 which is applied from the front face 13a of the panel body 13, for example by a finger 14, only to the region required for functioning, the sensor element 10 on the rear face 13b of the panel body 13 is surrounded, along its periphery, by a shielding element which is likewise firmly connected to the panel body 13. This shielding element is formed from a shielding layer 11, which is composed of an electrically conductive material and is connected to the rear face 13b of the panel body 13, and an insulating layer 12 which is composed of an electrically insulating material which substantially completely surrounds the shielding layer 11.

As is illustrated in the FIGURE, the sensor element 10 extends beyond the actual sensor area of the operator control panel as far as beyond the shielding element 11, 12. There, the sensor element 10 is connected to a conversion electronics system 16 through the use of a connection element 15 which is composed of an electrically conductive material. The electrically conductive material is electrically conductive at least in its thickness direction (direction from top to bottom in the FIGURE), for example a conductive adhesive in the form of an electrically conductive film or foil and/or paste.

The conversion electronics system 16 converts the capacitance values generated at the sensor element 10 into digital signals and transmits these digital signals to a central control device or control electronics system 20 of the respective domestic appliance, for example, through the use of a (generally flexible) cable connection 19.

The conversion electronics system 16 is mounted, for example, on a printed circuit board and is fitted substantially with a module (for example a CD converter) which is required to convert the capacitive values, that are generated by the sensor element 10 on the lower face 13b of the panel when the upper face 13a of the panel is touched, into digital signals. Furthermore, the other components which are required for the circuit and without which the CD converter cannot operate, are provided on the printed circuit board of the conversion electronics system 16. The electrical connection to the control electronics system 20 (for data transfer to the control electronics system 20 and for supplying power to the conversion electronics system 16) is made through the use of the cable connection 19.

The control electronics system 20 of the domestic appliance accepts the digital signals transmitted by the conversion electronics system 16 and processes these digital signals further. Therefore, the control electronics system 20 controls the various functions (for example washing program, spin speed, discharge-pumping function, etc.) which are required for the domestic appliance (for example a washing machine). The control electronics system 20 therefore forms the connection to the so-called hardware components of the domestic appliance. In addition, the control electronics system also contains the selection options required for the functions by way of the software which is integrated in the control electronics system.

The conversion electronics system 16 is likewise firmly, that is to say permanently, connected to the panel body 13 of the operator control panel. In order to ensure reliable electrical contact between the sensor element 10 and the conversion electronics system 16, a corresponding retaining apparatus 18 is used to exert a permanent contact-pressure force 18a which presses the conversion electronic system 16 against the connection element 15 and the sensor element 10. This ensures that the system does not become electrically inoperable due to either thermal or mechanical influences and loads.

If a plurality of sensor elements 10 are provided on the operator control panel 13, the sensor elements are preferably coupled to a common conversion electronics system 16. However, it is optionally also possible to connect individual groups of sensor elements 10 or individual sensor elements 10 each to one or more respective conversion electronics systems 16.

In order to produce the above-described functional group, the shielding element 11, 12 and the sensor element 10 are preferably printed onto the rear face 13b of the panel body 13 one after the other. The shielding element 11, in the form of a first layer of the overall system, preferably sufficiently covers all of the conductive regions which are not directly required for subsequent functioning. The shielding element is therefore matched to the structure of the sensor area which is respectively used.

This is followed by a second compression process in which the insulation layer 12 is printed on. The insulation layer 12 therefore has to be formed in such a way that the regions required for subsequent functioning of the sensor surface or sensor surfaces remain free, but the shielding layer 11 which is applied beforehand is fully covered as far as possible. This ensures that there is no electrical connection between the shielding layer 11 and the actual sensor area.

As a concluding compression step, the sensor element 10 according to the structure of the invention is printed onto the rear face 13b of the panel body 13 in order to form the capacitive sensor area. Due to the printing, the sensor element 10 "nestles" against the panel body 13. This has the advantage that a connection to the panel body is formed without an air gap. This minimizes disturbances during operator control since a situation in which the operator control panel is touched from the front face 13a is immediately registered by the sensor element 10.

Subsequently, the connection element 15 and the conversion electronics system 16 are mounted. The connection element (film or foil, paste, adhesive) 15 is applied through the use of a customary device in the region in which contact is made with the sensor element 10.

The invention claimed is:

1. An operator control panel for a domestic appliance having a control electronics system, the operator control panel comprising:
    a panel body having an operator control face facing towards a user and a rear face facing away from said operator control face;
    a sensor element disposed on said rear face of said panel body, firmly connected to said panel body and formed of an electrically conductive material, said sensor element and said panel body together forming a capacitive sensor area;
    a conversion electronics system disposed on said rear face of said panel body for converting capacitance values generated in said sensor area into digital signals, said conversion electronics system being firmly connected to said panel body and electrically conductively connected to said sensor element; and
    said sensor element and said conversion electronics system being two components mechanically decoupled from the control electronics system of the domestic appliance.

2. The operator control panel according to claim 1, which further comprises a shielding element firmly connected to said panel body and surrounding said sensor element in a peripheral direction.

3. The operator control panel according to claim 2, wherein said shielding element includes a shielding layer of an electrically conductive material connected to said panel body and an insulation layer of an electrically insulating material substantially completely surrounding said shielding layer.

4. The operator control panel according to claim 2, wherein said shielding element is printed onto said rear face of said panel body.

5. The operator control panel according to claim 1, wherein said sensor element is printed onto said rear face of said panel body.

6. The operator control panel according to claim 1, which further comprises a connection element of an electrically conductive material interconnecting said sensor element and said conversion electronics system.

7. The operator control panel according to claim 1, which further comprises a retaining apparatus for pressing said conversion electronics system and said sensor element against one another.

8. The operator control panel according to claim 1, wherein said sensor element is one of a plurality of sensor elements disposed on said rear face of said panel body.

9. The operator control panel according to claim 1, which further comprises a cable connection electrically connecting said conversion electronics system to the control electronics system of the domestic appliance.

10. An operator control panel for a domestic appliance having a control electronics system, the operator control panel comprising:
- a panel body having an operator control face facing towards a user and a rear face facing away from said operator control face;
- a sensor element disposed on said rear face of said panel body, firmly connected to said panel body and formed of an electrically conductive material, said sensor element and said panel body together forming a capacitive sensor area;
- a conversion electronics system disposed on said rear face of said panel body for converting capacitance values generated in said sensor area into digital signals, said conversion electronics system being firmly connected to said panel body and electrically conductively connected to said sensor element; and
- a flexible cable connection electrically connecting said conversion electronics system to the control electronics system of the domestic appliance.

11. An operator control panel for a domestic appliance having a control electronics system, the operator control panel comprising:
- a panel body having an operator control face facing towards a user and a rear face facing away from said operator control face;
- a plurality of sensor elements of an electrically conductive material printed onto said rear face of said panel body, said sensor elements each forming a respective capacitive sensor area together with said panel body;
- at least one conversion electronics system disposed on said rear face of said panel body for converting capacitance values generated in said sensor areas into digital signals, said conversion electronics system being firmly connected to said panel body and electrically conductively connected to said sensor elements; and
- said sensor elements and said at least one conversion electronics system being components mechanically decoupled from the control electronics system of the domestic appliance.

* * * * *